(12) United States Patent
Oh et al.

(10) Patent No.: US 12,358,734 B2
(45) Date of Patent: Jul. 15, 2025

(54) WAFER TRANSFER ROBOT APPARATUS BASED ON DIRECT DRIVE MOTOR

(71) Applicant: RAONTEC Inc., Suwon-si (KR)

(72) Inventors: Jin Ho Oh, Seoul (KR); Sang Chan Choi, Gunpo-si (KR); Zheng Yuan Li, Suwon-si (KR)

(73) Assignee: RAONTEC INC., Suwon-si (KR)

( * ) Notice: Subject to any disclaimer, the term of this patent is extended or adjusted under 35 U.S.C. 154(b) by 449 days.

(21) Appl. No.: 17/903,513

(22) Filed: Sep. 6, 2022

(65) Prior Publication Data

US 2023/0133347 A1    May 4, 2023

(30) Foreign Application Priority Data

Oct. 29, 2021 (KR) .................. 10-2021-0146699

(51) Int. Cl.
*H01L 21/687*    (2006.01)
*B65G 47/90*    (2006.01)

(52) U.S. Cl.
CPC ........ *B65G 47/90* (2013.01); *H01L 21/68707* (2013.01)

(58) Field of Classification Search
None
See application file for complete search history.

(56) References Cited

U.S. PATENT DOCUMENTS

| 6,234,738 | B1 * | 5/2001 | Kimata | ............. H01L 21/68707 |
| | | | | 414/416.03 |
| 6,752,584 | B2 * | 6/2004 | Woodruff | .......... H01L 21/67173 |
| | | | | 198/346.2 |
| 9,995,378 | B2 * | 6/2018 | Hiroki | ................. H01L 21/6719 |
| 2017/0252985 | A1 * | 9/2017 | Wang | ..................... B29C 70/44 |

FOREIGN PATENT DOCUMENTS

KR    10-1382145 B1    4/2014

* cited by examiner

*Primary Examiner* — Michael S Lowe
(74) *Attorney, Agent, or Firm* — Paratus Law Group, PLLC

(57) ABSTRACT

A wafer transfer robot apparatus based on a direct drive motor, includes: a hand module including a hand loading a wafer from one surface and a hand arm coupled to the hand to transfer the wafer; an R-axis module; a connecting enclosing module having one end coupled to the R-axis module; and a T-axis module rotatably coupled to the connecting enclosure module.

8 Claims, 9 Drawing Sheets

100

130

170

WAFER TRANSFER ROBOT APPARATUS BASED ON DIRECT DRIVE MOTOR

CROSS-REFERENCE TO RELATED APPLICATION

This application claims priority to Korean Patent Application No. 10-2021-0146699 (filed on Oct. 29, 2021), which is hereby incorporated by reference in its entirety.

BACKGROUND

The present disclosure relates to wafer transfer robot technology, and more particularly, to a wafer transfer robot apparatus based on a direct drive motor capable of simplify driving parts of the wafer transfer robot and improving overall vibration and precision.

As semiconductor technology advances, specifications of a wafer transfer robot required in a semiconductor process have been upgraded.

In the existing wafer transfer robot, arms or linkages of the transfer robot are configured in a coaxial manner to enable movement of, for example, three degrees of freedom or more using a plurality of motors. An outermost shaft is coupled to a hub for rotating multiple arms, for example, about a central axis of rotation, and two inner shafts may be connected to each of the multiple arms via independent belt and pulley configurations.

In order to mount two hands on the arms of the wafer transfer robot that are used in the past, the arms are lengthened or upper and lower arms are disposed up and down. However, in the case of such a configuration, as the length of the arm increases, the structural rigidity decreases, and thus, the precision of the transfer operation decreases.

When the rigidity of the arm increases to improve precision, a weight of the arm increases or a size of the transfer robot increases, which causes difficulties in installation.

RELATED ART DOCUMENT

Patent Document (Patent Document 0001) Korean Patent No. 10-1382145 (2014.04.01)

SUMMARY

The present disclosure provides a wafer transfer robot apparatus based on a direct drive motor capable of simplifying driving parts of the wafer transfer robot and improving overall vibration and precision.

The present disclosure provides a wafer transfer robot apparatus based on a direct drive motor capable of reducing a weight and volume of R-axis and T-axis driving modules of the wafer transfer robot and reducing costs by using the direct drive motor.

The present disclosure provides a wafer transfer robot apparatus based on a direct drive motor capable of minimizing a space for maintaining vacuum by disposing a part of the direct drive motor and an encoder in a vacuum environment and dividing the vacuum and the atmospheric environment with a vacuum blocking thin film.

According to embodiments of the present disclosure, a wafer transfer robot apparatus based on a direct drive motor includes: a hand module including a hand loading a wafer from one surface and a hand arm coupled to the hand to transfer the wafer; an R-axis module including a central axis having one end coupled to a hand arm, a rotating motor member coupled along an outer circumference of the central axis, a fixed motor member fixed to the outer circumference of the rotating motor member, and a cylindrical vacuum blocking thin film disposed between the rotating motor member and the fixed motor member to isolate an inside thereof in a vacuum, and providing power to the hand module through the rotating motor member; a connecting enclosing module having one end coupled to the R-axis module; and a T-axis module including a central axis of rotation rotatably coupled to the other end of the connecting enclosure module, a magnetic fluid seal enclosing an outside of the central axis of rotation, and a motor disposed along a lower outer circumference of the central axis of rotation to provide a rotational force to the central axis of rotation.

The wafer transfer robot apparatus of claim 1, wherein the hand module may include: first and second link arms; and an auxiliary central axis coupling one end of the central axis through the first link arm and coupling the hand arm through the second link arm to provide a rotational force of the central axis to the hand arm.

The R-axis module may implement the direct drive motor through the rotating motor member and the fixed motor member, and provide the power to the hand module by arranging the plurality of direct drive motors side by side.

The R-axis module may include: a rotating side encoder coupled to the other end of the central axis; a fixed side encoder disposed to face the rotating side encoder; and a sheet-type vacuum blocking thin film disposed between the rotating side encoder and the fixed side encoder.

The T-axis module may include an enclosure that includes a circular support plate protruding out of a circumference to support the connecting enclosure module and encloses the magnetic fluid seal through the circumference.

The T-axis module may include an atmospheric through hole forming an atmosphere inside the central axis of rotation.

The T-axis module may extend the atmospheric through hole to a center of the motor, and configure the motor as the direct drive motor with a lower rotating motor member disposed inside the lower outer circumference and a lower fixed motor member disposed outside.

The R-axis module and the T-axis module may be driven independently of each other, the T-axis module may operate to rotate the R-axis module to set a direction of the hand, and the R-axis module may operate to perform forward and backward motions of the hand.

The disclosed technology can have the following effects. However, since a specific embodiment is not construed as including all of the following effects or only the following effects, it should not be understood that the scope of the disclosed technology is limited to the specific embodiment.

According to a wafer transfer robot apparatus based on a direct drive motor according to an embodiment of the present disclosure, it is possible to simplify driving parts of the wafer transfer robot and improve overall vibration and precision.

According to a wafer transfer robot apparatus based on a direct drive motor according to an embodiment of the present disclosure, it is possible to reduce a weight and volume of R-axis and T-axis driving modules of the wafer transfer robot and reducing costs by using the direct drive motor.

According to a wafer transfer robot apparatus based on a direct drive motor according to an embodiment of the present disclosure, it is possible to minimize a space for maintaining vacuum by disposing a part of the direct drive motor and an encoder in a vacuum environment and dividing the vacuum and the atmospheric environment with a vacuum blocking thin film, thereby saving maintenance costs.

BRIEF DESCRIPTION OF THE DRAWINGS

FIG. 1A illustrates an appearance of a wafer transfer robot apparatus based on a direct drive motor, and FIG. 1B illustrates a state in which an outer housing is removed from FIG. 1A.

DETAILED DESCRIPTION

Figure 1A:
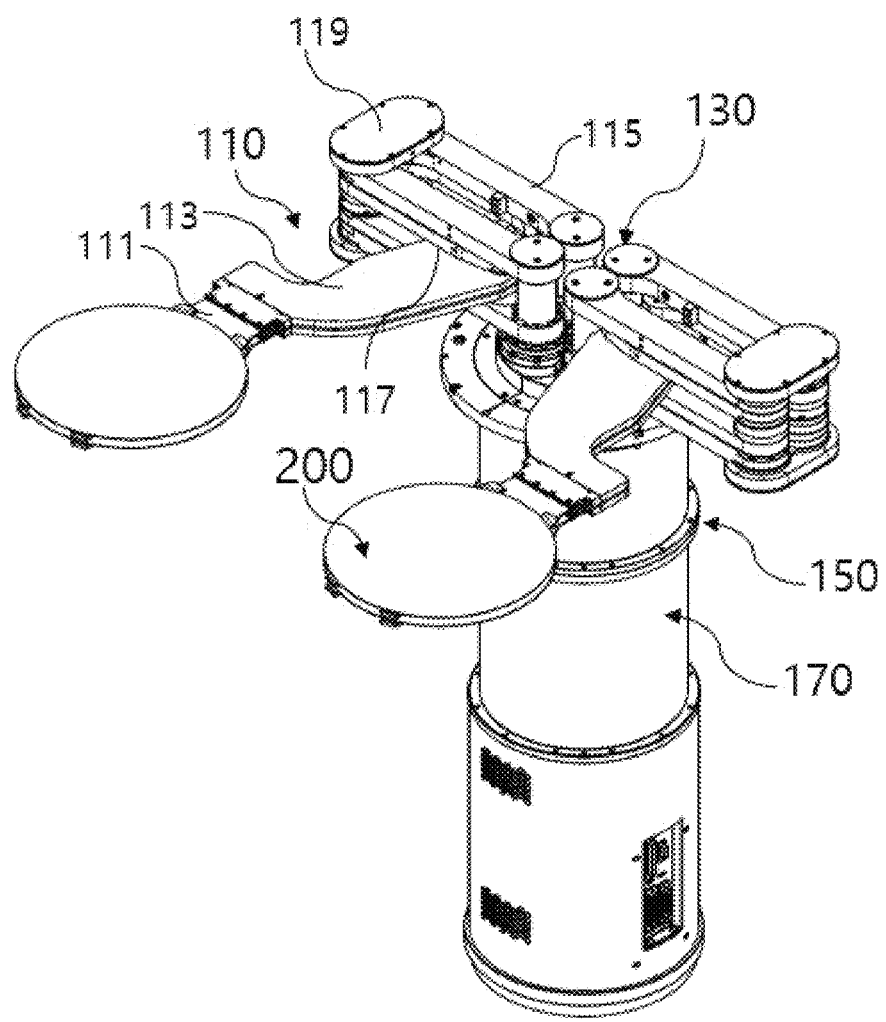
FIGS. 1A and 1B are perspective views for describing a wafer transfer robot apparatus based on a direct drive motor according to an embodiment of the present disclosure.

Since the description of the present disclosure is merely an embodiment for structural or functional explanation, the scope of the present disclosure should not be construed as being limited by the embodiments described in the text. That is, since the embodiments may be variously modified and may have various forms, the scope of the present disclosure should be construed as including equivalents capable of realizing the technical idea. In addition, a specific embodiment is not construed as including all the objects or effects presented in the present disclosure or only the effects, and therefore the scope of the present disclosure should not be understood as being limited thereto.

On the other hand, the meaning of the terms described in the present application should be understood as follows.

Terms such as "first" and "second" are intended to distinguish one component from another component, and the scope of the present disclosure should not be limited by these terms. For example, a first component may be named a second component and the second component may also be similarly named the first component.

It is to be understood that when one element is referred to as being "connected to" another element, it may be connected directly to or coupled directly to another element or be connected to another element, having the other element intervening therebetween. On the other hand, it is to be understood that when one element is referred to as being "connected directly to" another element, it may be connected to or coupled to another element without the other element intervening therebetween. Meanwhile, other expressions describing a relationship between components, that is, "between", "directly between", "neighboring to", "directly neighboring to" and the like, should be similarly interpreted.

It should be understood that the singular expression include the plural expression unless the context clearly indicates otherwise, and it will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

In each step, an identification code (for example, a, b, c, and the like) is used for convenience of description, and the identification code does not describe the order of each step, and each step may be different from the specified order unless the context clearly indicates a particular order. That is, the respective steps may be performed in the same sequence as the described sequence, be performed at substantially the same time, or be performed in an opposite sequence to the described sequence.

Unless defined otherwise, all the terms used herein including technical and scientific terms have the same meaning as meanings generally understood by those skilled in the art to which the present disclosure pertains. It should be understood that the terms defined by the dictionary are identical with the meanings within the context of the related art, and they should not be ideally or excessively formally defined unless the context clearly dictates otherwise.

Figure 1B:
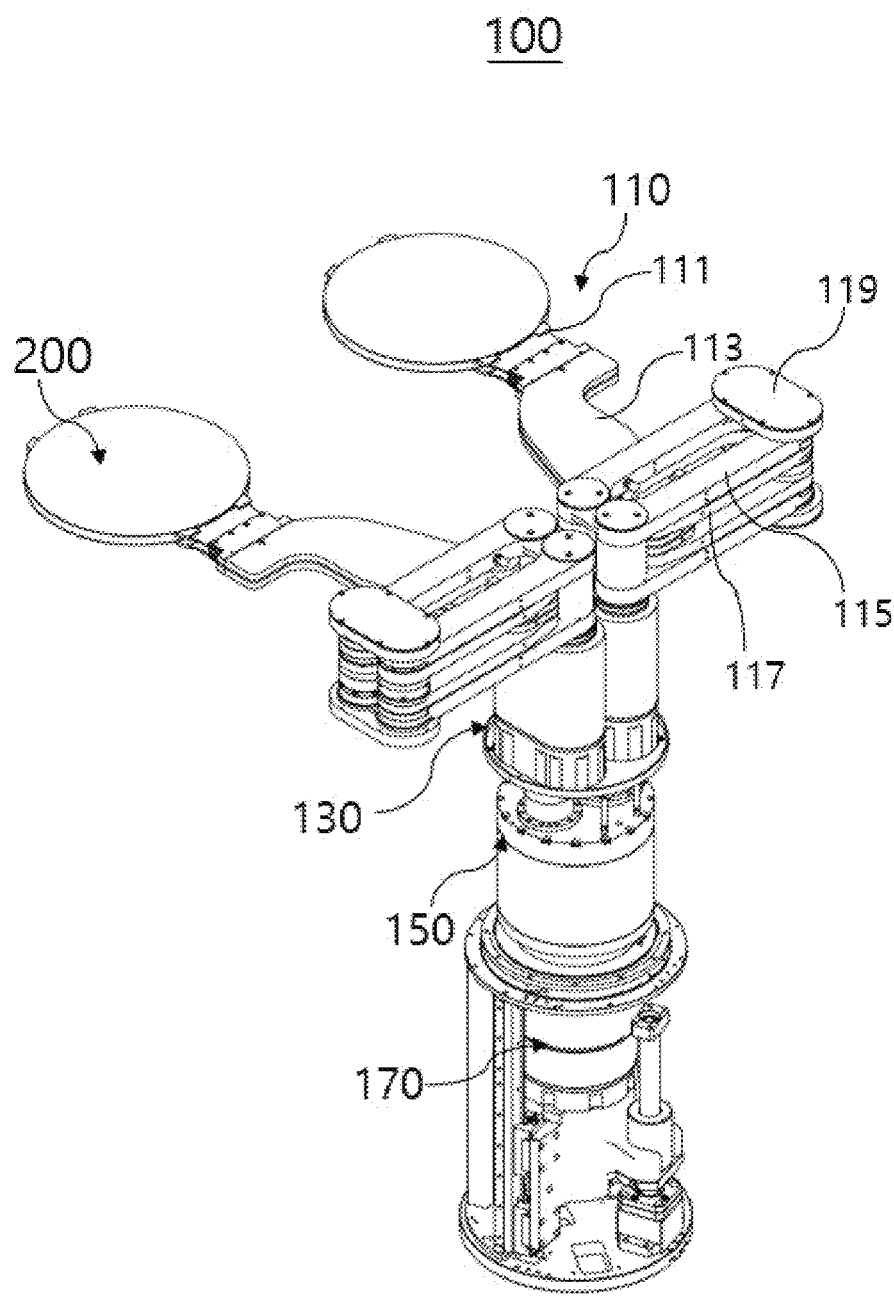
Figure 2:
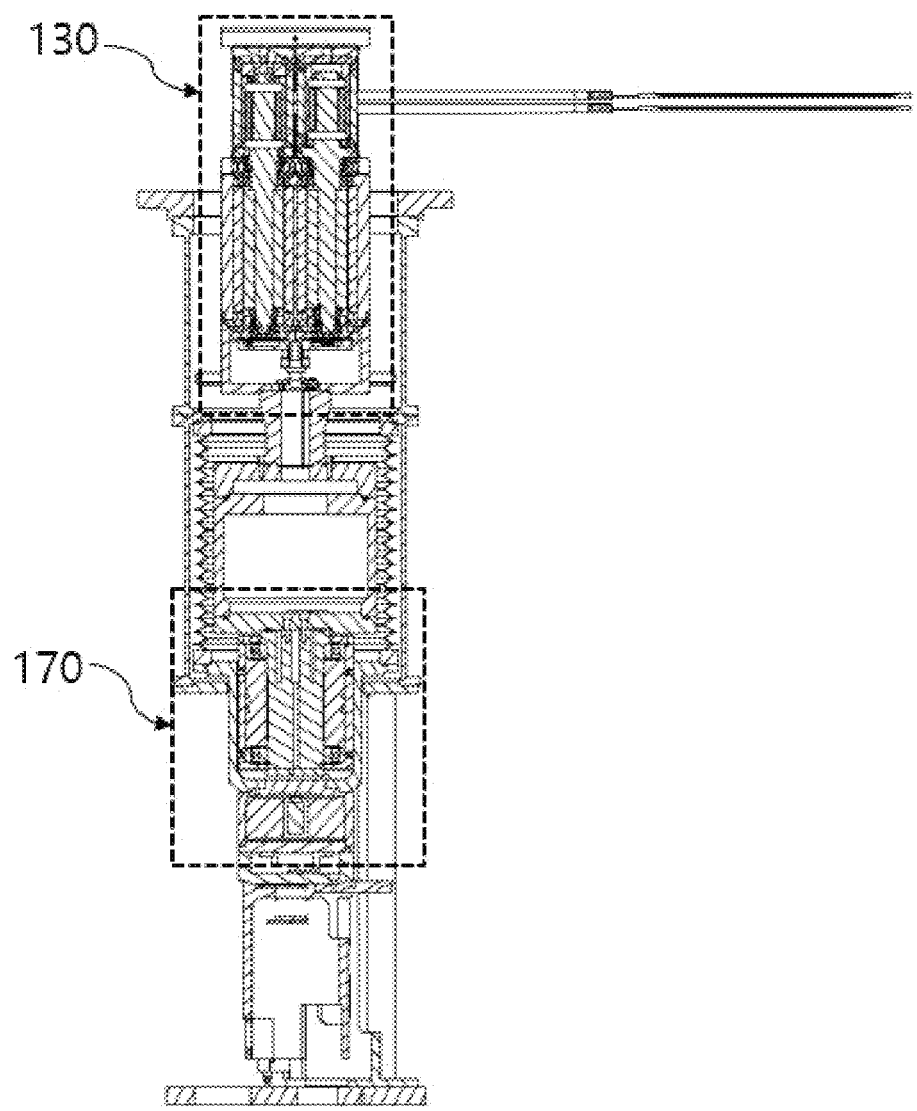
FIG. 2 is a cross-sectional view for describing the wafer transfer robot apparatus in FIGS. 1A and 1B.

FIGS. 1A and 1B are perspective views for describing a wafer transfer robot apparatus based on a direct drive motor according to an embodiment of the present disclosure, and FIG. 2 is a cross-sectional view for describing the wafer transfer robot apparatus in FIGS. 1A and 1B.

Here, FIG. 1A illustrates an appearance of a wafer transfer robot apparatus 100 based on a direct drive motor, and FIG. 1B illustrates a state in which an outer housing is removed from FIG. 1A.

Referring to FIGS. 1 and 2, the wafer transfer robot apparatus 100 based on a direct drive motor may include a hand module 110, an R-axis module 130, a connecting enclosure module 150, and a T-axis module 170.

The hand module 110 includes a hand 111 capable of loading the wafer 200 on one surface, a hand arm 113 coupled to the hand 111 to transport the wafer 200, and first and second link arms 115 and 117.

The hand arm 113 is disposed on left and right sides of the robot, respectively, and the hand 111 is coupled to one end. The hand 111 may be made of a lightweight metal material such as aluminum (Al) in order to reduce the overall weight while increasing structural rigidity. The hand 111 includes a finger on which the wafer 200 is seated, and the finger may be made of a material that generates little vibration without damaging the wafer 200 due to static electricity. The wafer transfer robot apparatus 100 loads the wafer 200 on the hand 111 and transfers the wafer 200 to a desired position by turning and stretching the hand arm 113.

The first link arm 115 is coupled to a central axis of the R-axis module 130, and the second link arm 117 is coupled to the other end of the hand arm 113. The first and second link arms 115 and 117 are connected by a predetermined height difference through an auxiliary central axis 119.

The auxiliary central axis 119 couples one end of the central axis of the R-axis module 130 through the first link arm 115 and the hand arm 113 through the second link arm 117 to provide a rotational force of the central axis of the R-axis module 130 to the hand arm 113.

When the rotational force of the central axis of the R-axis module 130 is provided through the auxiliary central axis 119, the hand module 110 rotates the second link arm 115, and thus, is coupled to the second link arm 115 to rotate the hand arm 113.

The R-axis module 130 is an axis for rotating individual link arms, and provides power to the hand module 110. The existing R-axis module has a structure including a motor, a reducer, and a magnetic fluid seal, but the R-axis module 130 is changed to a structure including a direct drive motor, an encoder, and a vacuum blocking thin film. When the magnetic fluid seal is used, the price of equipment increases because the structure is complicated and expensive magnetic fluid seal should be purchased. In the present disclosure, the R-axis module 130 replaces the magnetic fluid seal with a vacuum blocking thin film to maintain a vacuum state without using the magnetic fluid seal, so that the R-axis module is easy to manage and the price of equipment becomes cheaper than before.

Figure 3A:
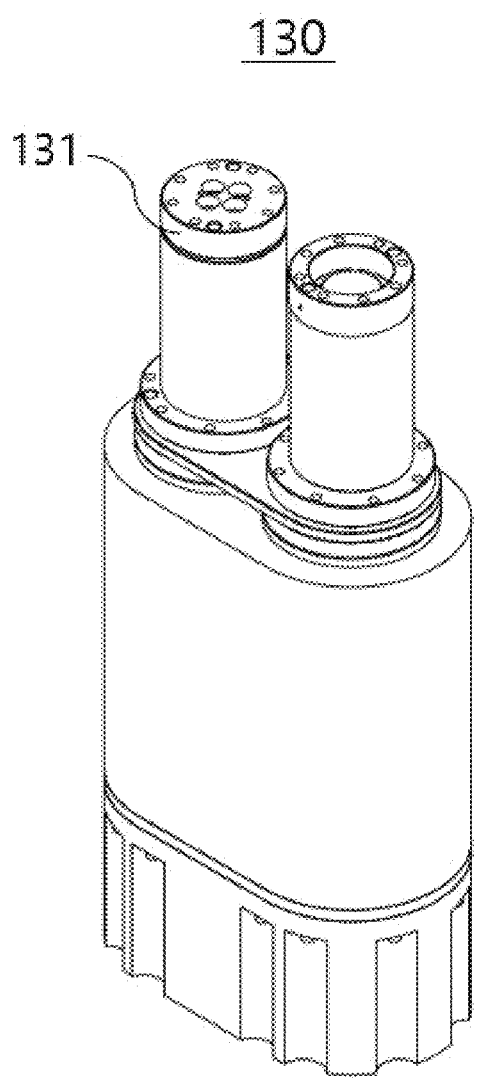
FIGS. 3A to 3B are a perspective view and a cross-sectional view for describing an R-axis module in FIGS. 1A and 1B.
Figure 3B:
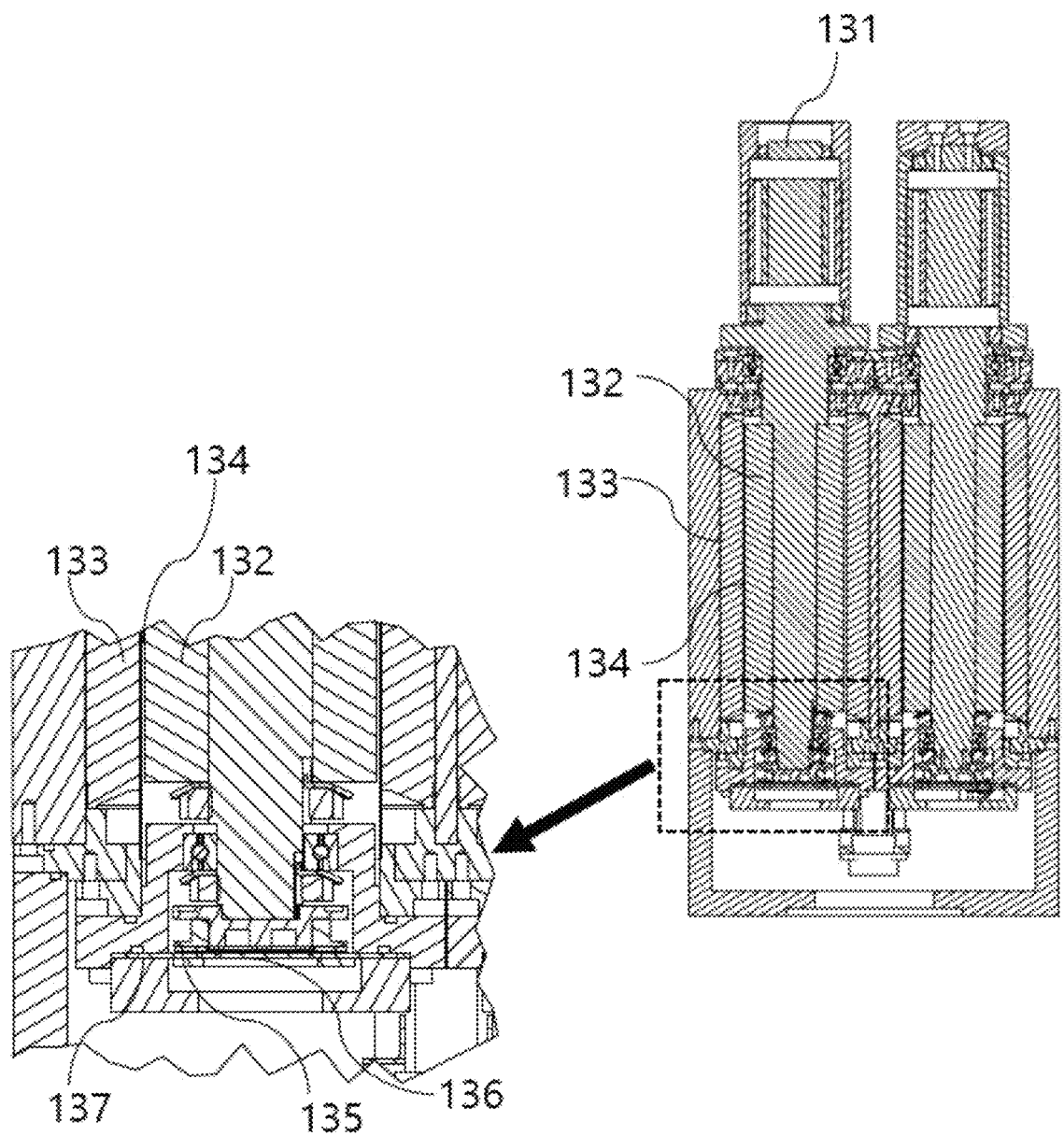

FIGS. 3A to 3B are a perspective view and a cross-sectional view for describing the R-axis module in FIGS. 1A and 1B.

Referring to FIGS. 3A and 3B, the R-axis module 130 has a central axis 131 having one end coupled to a hand arm 113, a rotating motor member 132 coupled along an outer circumference of the central axis 131, a fixed motor member 133 fixed to the outer circumference of the rotating motor member 132, and a cylindrical vacuum blocking thin film 134 disposed between the rotating motor member 132 and the fixed motor member 133 to isolate the inside in a vacuum.

The R-axis module 130 may implement a direct drive motor through the rotating motor member 132 and the fixed motor member 133. Here, the rotating motor member 132 and the fixed motor member 133 may correspond to the rotating side and the fixed side of the direct drive motor, respectively. The R-axis module 130 may provide power to the hand module 110 by arranging a plurality of direct drive motors side by side.

A direct drive (DD) motor refers to a method that directly transmits a rotational force of a motor to a drive target without passing through a mechanism such as a reducer, and may minimize damage caused by friction, such as mechanism and reduce noise by reducing the number of parts that cause contact or vibration.

The R-axis module 130 may reduce friction and abrasion occurring in a transmission part by attaching the direct drive motor as the motor member to the central axis 131.

The cylindrical vacuum blocking thin film 134 may be disposed between the rotating motor member 132 and the fixed motor member 133 to isolate the rotating motor member 132 in a vacuum. The R-axis module 130 may divide the rotating motor member 132 and the fixed motor member 133 into a vacuum and an atmospheric environment through the cylindrical vacuum blocking thin film 134. The R-axis module 130 may provide power to the hand module 110 through the rotating motor member 132 in a vacuum state.

The R-axis module 130 has a rotating side encoder 135 coupled to the other end of the central axis 131, and a fixed side encoder 136 disposed opposite to the rotating side encoder 135. A sheet-type vacuum blocking thin film 137 is disposed between the rotating side encoder 135 and the fixed side encoder 136. The sheet-type vacuum blocking thin film 137 may be disposed between the rotating motor member 132 and the fixed motor member 133 to isolate the rotating side encoder 135 in a vacuum. The R-axis module 130 may divide the rotating motor member 132 and the fixed motor member 133 into a vacuum and an atmospheric environment through the sheet-type vacuum blocking thin film 137.

The R-axis module 130 may reduce the weight and volume by maintaining the vacuum state using the vacuum blocking thin films 134 and 137, and reduce costs compared to using an expensive magnetic fluid seal. The R-axis module 130 may minimize an area maintaining a vacuum state by placing a part of the direct drive motor and the encoder in the vacuum environment and dividing the vacuum and the atmospheric environment with the vacuum blocking thin films 134 and 137.

Returning back to FIGS. 1 and 2, the R-axis module 130 has the hand arm 113 through the first and second link arms 115 and 117 coupled to one end thereof and the connecting enclosure module 150 coupled to the other end thereof.

One end of the connecting enclosure module 150 is coupled to the R-axis module 130 and the other end thereof is coupled to the T-axis module 170, so the connecting enclosure module 150 is rotatable by the rotational force provided through the T-axis module 170. Here, the connecting enclosure module 150 connects the R-axis module 130 and the T-axis module 170.

The T-axis module 170 is an axis for rotating an upper portion of a robot including the R-axis module 130, and is rotatably coupled to the connecting enclosure module 150. The existing T-axis module has a structure including a motor, a belt, a pulley, a reducer, and a magnetic fluid seal, but the R-axis module 170 is changed to a structure in which the direct drive motor, the encoder, and the magnetic fluid seal are stacked.

Figure 4A:
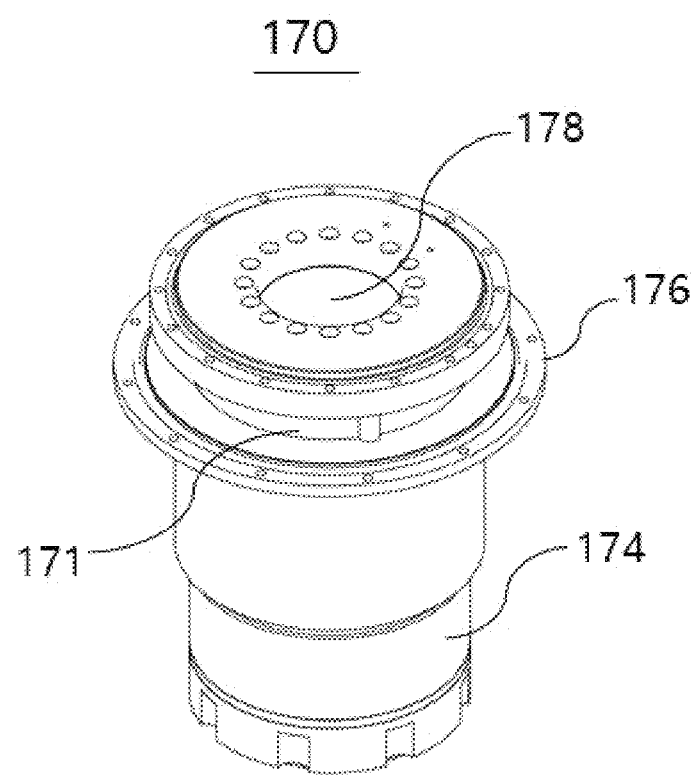
FIGS. 4A to 4B are a perspective view and a cross-sectional view for describing a T-axis module in FIGS. 1A and 1B.
Figure 4B:
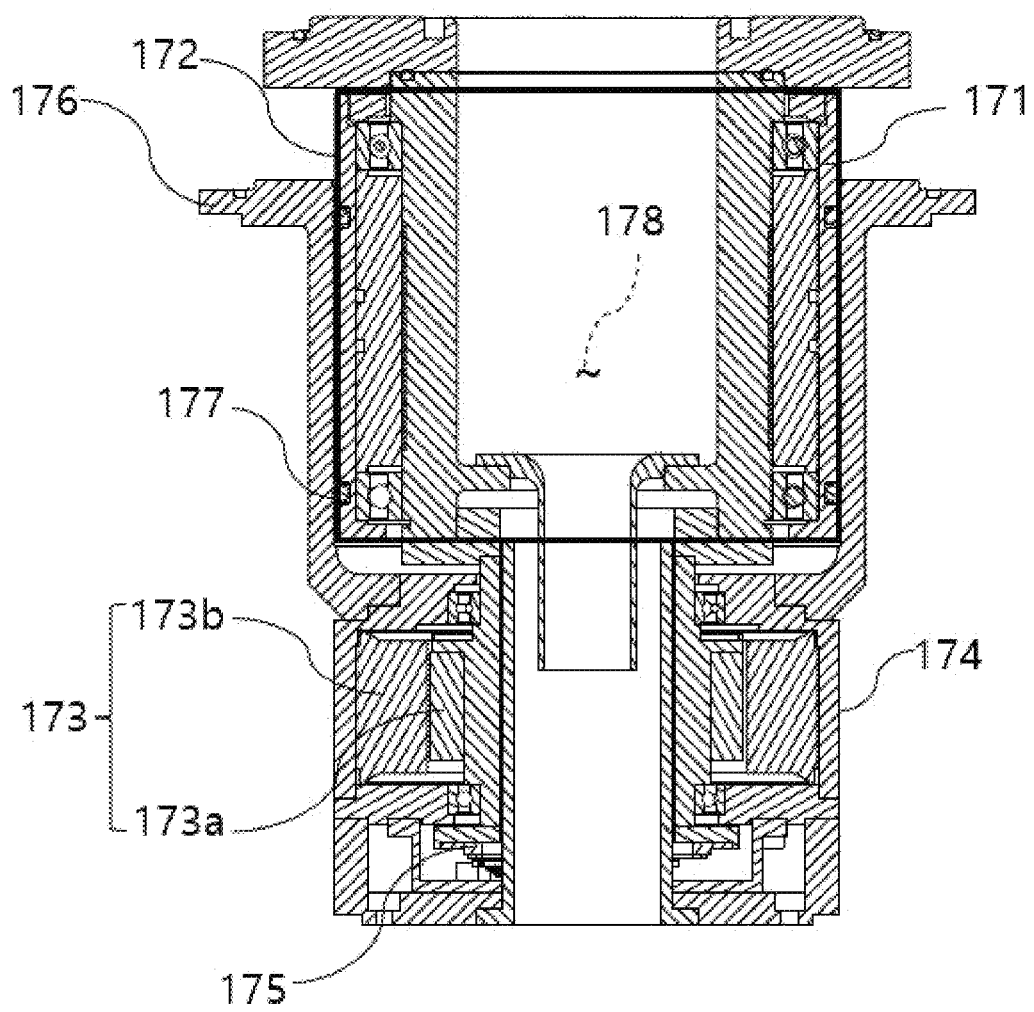

FIGS. 4A to 4B are a perspective view and a cross-sectional view for describing the T-axis module in FIGS. 1A and 1B.

Referring to FIGS. 4A and 4B, the T-axis module 170 is configured to include a central axis of rotation 171, a magnetic fluid seal 172, and a motor 173.

The central axis of rotation 171 rotatably couples the connecting enclosure module 150. The magnetic fluid seal 172 wraps around the outside of the central axis of rotation 171 and isolates the inside in a vacuum. The motor 173 is disposed along a lower outer circumference 174 of the central axis of rotation 171 to provide the rotational force to the central axis of rotation 171. Here, the motor 173 is the direct drive (DD) motor, and is configured to include a lower rotating motor member 173a disposed inside the lower outer circumference 174 of the central axis of rotation and a lower fixed motor member 173b disposed outside. The lower rotating motor member 173a and the lower fixed motor member 173b may correspond to the rotating side and the fixed side of the direct drive motor, respectively. The T-side module 170 may provide the rotational force to the central axis of rotation 171 by disposing the motor 173, which may be a direct drive motor, under the central axis of rotation 171.

The T-axis module 170 includes a lower encoder 175 under the motor 173. Here, the T-axis module 170 may be configured in the structure in which the lower encoder 175, the motor 173, and the magnetic fluid seal 172 are stacked in the order from the bottom to the top to reduce the volume.

The T-side module 170 includes a circular support plate 176 protruding out of the circumference to support the connecting enclosure module 150 and an enclosure 177 surrounding the magnetic fluid seal 172 through the circumference. The T-axis module 170 includes an atmospheric through hole 178 that forms an atmosphere inside the central axis of rotation 171, and the atmospheric through hole 178 extends to the center of the motor 173.

Referring back to FIGS. 1 and 2, the R-axis module 130 and the T-axis module 170 are driven independently of each other. The T-axis module 170 operates to set the direction of the hand 111 by rotating the R-axis module 130. The R-axis module 130 operates to perform the forward and backward motions of the hand 111.

Figure 5:
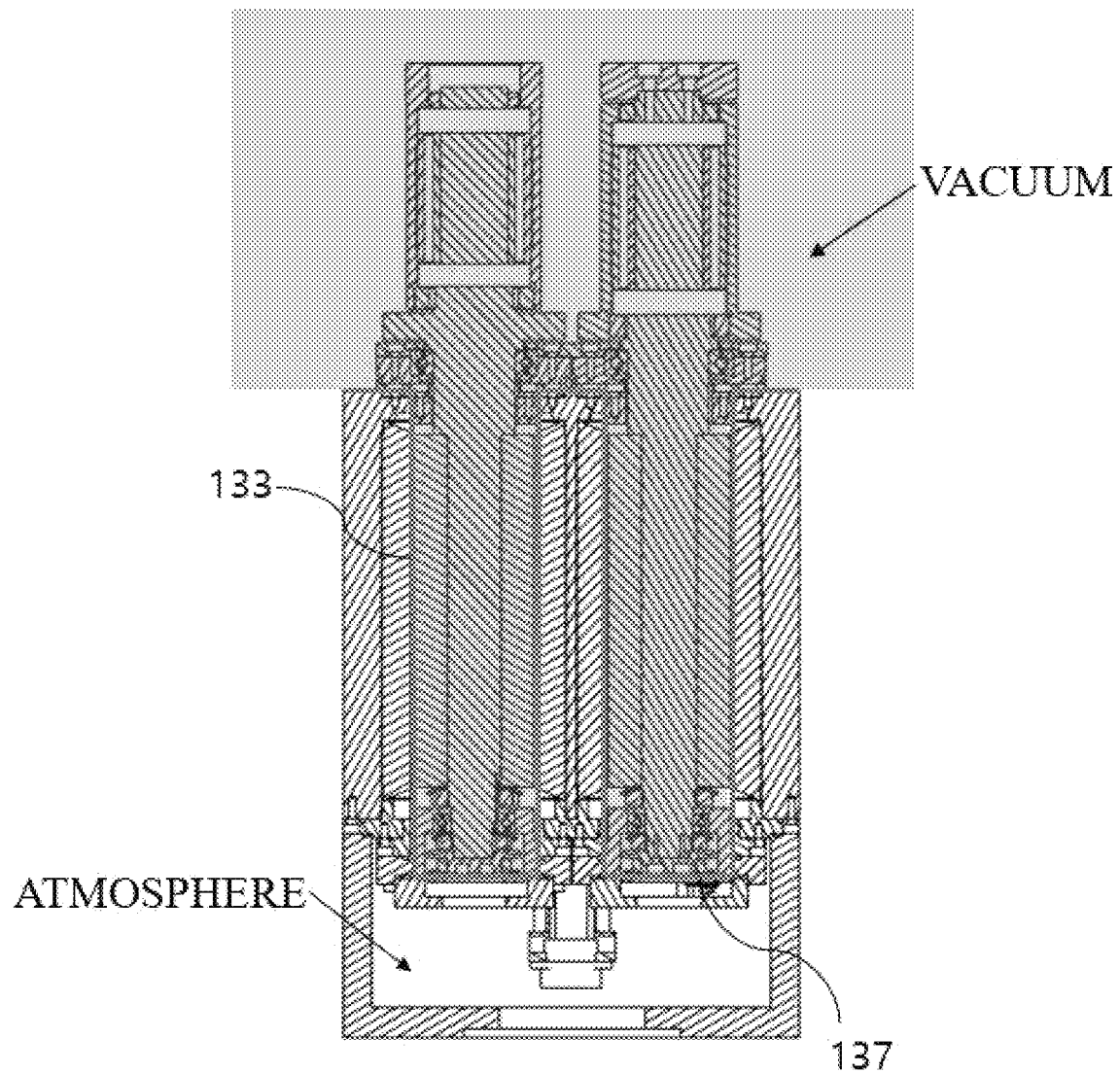
FIG. 5 is a diagram for describing a vacuum environment of the R-axis module in FIG. 3B.

FIG. 5 is a diagram for describing the vacuum environment of the R-axis module in FIG. 3B.

Referring to FIG. 5, the R-axis module 130 may place the vacuum blocking thin films 134 and 137 between the rotating motor member 132 and the fixed motor member 133 coupled along the outer circumference of the central axis 131 and between the rotating side encoder 135 and the fixed side encoder 136 coupled to the end portion of the central axis 131 to isolate the inside in a vacuum. The R-axis module 130 may put the central axis 131, the rotating motor member 132, the rotating side encoder 135 disposed inside the vacuum blocking thin films 134 and 137 in the vacuum environment and put the fixed motor member 133 and the fixed side encoder 136 in the atmospheric environment. The R-axis module 130 may divide the vacuum and the atmospheric environment through the vacuum blocking thin films 134 and 137.

Figure 6:
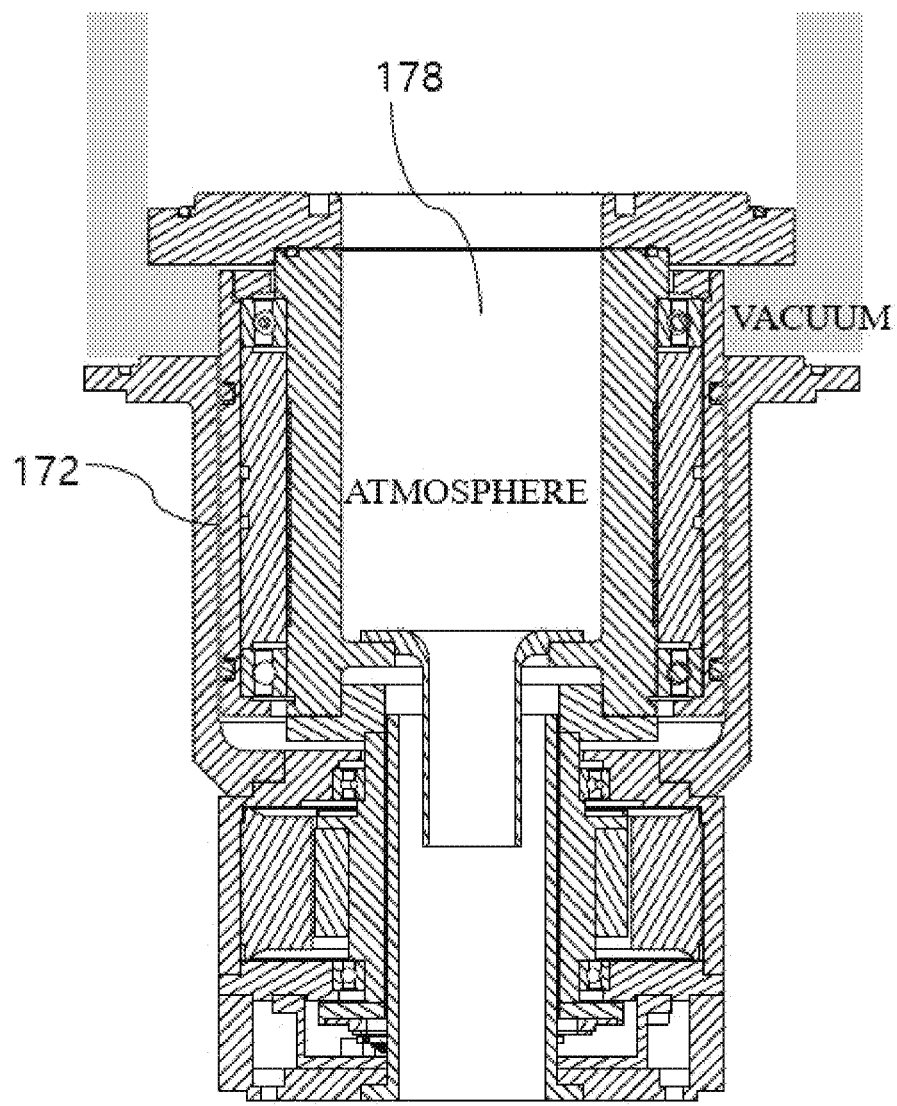
FIG. 6 is a diagram for describing a vacuum environment of the T-axis module in FIG. 4B.

FIG. 6 is a diagram for describing the vacuum environment of the T-axis module in FIG. 4B.

Referring to FIG. 6, the T-axis module 170 may dispose the magnetic fluid seal 172 in the form enclosing the outside of the central axis of rotation 171 that rotatably couples the connecting enclosure module 150 to seal the outside of the central axis of rotation 171 in the vacuum state. The T-axis module 170 may form the atmospheric through hole 178 on the inside of the central axis of rotation 171 to maintain the inside of the central axis of rotation 171 in the atmospheric state. The T-axis module 170 has the atmospheric through hole 178 extending to the center of the motor 173 to minimize an area for maintaining a vacuum state by placing the motor 173 and the encoder 175 the atmospheric environment.

The wafer transfer robot apparatus based on a direct drive motor according to the embodiment may use the direct drive (DD) motor to simplify parts, reduce vibration, and improve the precision of the transfer operation.

The wafer transfer robot apparatus based on a direct drive motor according to the embodiment may use the vacuum blocking thin film on the R-axis and has the structure in which the motor, the encoder, and the magnetic fluid seal are stacked on the T-axis to reduce the overall weight and volume and minimize the space to maintain the vacuum, thereby saving maintenance costs.

Although exemplary embodiments of the present disclosure have been disclosed hereinabove, it may be understood by those skilled in the art that the present disclosure may be variously modified and altered without departing from the scope and spirit of the present disclosure described in the following claims.

What is claimed is:

1. A wafer transfer robot apparatus including at least one direct drive motor, the wafer transfer robot apparatus comprising:
    a hand module including a hand configured to load a wafer from one surface and a hand arm coupled to the hand to transfer the wafer;
    an R-axis module including
        a central axis having a first end coupled to the hand arm,
        a rotating motor member of each direct drive motor coupled along an outer circumference of the central axis,
        a fixed motor member of each direct drive motor fixed to an outer circumference of the rotating motor member, and
        a cylindrical vacuum blocking thin film disposed between the rotating motor member and the fixed motor member of each direct drive motor to isolate an inside thereof in a vacuum,
    wherein the R-axis module is configured to provide power to the hand module through the rotating motor member;
    a connecting enclosure module having a first end coupled to the R-axis module; and
    a T-axis module including
        a central axis of rotation rotatably coupled to a second end of the connecting enclosure module,
        a magnetic fluid seal enclosing an outside of the central axis of rotation, and
        a motor disposed along a lower outer circumference of the central axis of rotation,
    wherein the motor of the T-axis module is configured to provide a rotational force to the central axis of rotation of the T-axis module, thereby rotating the R-axis module via the connecting enclosure module.

2. The wafer transfer robot apparatus of claim 1, wherein the hand module includes:
    first and second link arms; and
    an auxiliary central axis coupling one end of the central axis through the first link arm and coupling the hand arm through the second link arm to provide a rotational force of the central axis to the hand arm.

3. The wafer transfer robot apparatus of claim 1, wherein the R-axis module provides the power to the hand module by arranging a plurality of direct drive motors side by side.

4. The wafer transfer robot apparatus of claim 1, wherein the R-axis module includes:
    a rotating side encoder coupled to a second end of the central axis;
    a fixed side encoder disposed to face the rotating side encoder; and
    a sheet-type vacuum blocking thin film disposed between the rotating side encoder and the fixed side encoder.

5. The wafer transfer robot apparatus of claim 1, wherein the T-axis module includes an enclosure that includes a circular support plate protruding out of a circumference to support the connecting enclosure module and encloses the magnetic fluid seal through the circumference.

6. The wafer transfer robot apparatus of claim 1, wherein the T-axis module includes an atmospheric through hole forming an atmosphere inside the central axis of rotation.

7. The transfer robot apparatus of claim 6, wherein the T-axis module extends the atmospheric through hole to a center of the motor of the T-axis module, and configures the motor of the T-axis module as a direct drive motor with a lower rotating motor member disposed inside the lower outer circumference and a lower fixed motor member disposed outside the lower rotating motor member.

8. The wafer transfer robot apparatus of claim 1, wherein the R-axis module and the T-axis module are driven independently of each other,
    wherein the T-axis module operates to rotate the R-axis module to set a direction of the hand, and
    wherein the R-axis module operates to perform forward and backward motions of the hand.

* * * * *